United States Patent [19]

Asano et al.

[11] Patent Number: 4,992,682
[45] Date of Patent: Feb. 12, 1991

[54] CLOCK DRIVE CIRCUIT

[75] Inventors: Michio Asano, Tokorozawa; Makio Uchida, Ome; Toshihiro Okabe, Hadano, all of Japan

[73] Assignee: Hitachi, Ltd., Tokyo, Japan

[21] Appl. No.: 294,676

[22] Filed: Jan. 9, 1989

[30] Foreign Application Priority Data

Jan. 20, 1988 [JP] Japan .................................. 63-8309

[51] Int. Cl.$^5$ ..................... H03K 19/096; H03K 19/10
[52] U.S. Cl. .................................. 307/481; 307/448; 307/451; 307/219; 307/269; 307/270
[58] Field of Search ............... 307/443, 448, 451, 481, 307/269, 270, 219

[56] References Cited

U.S. PATENT DOCUMENTS 4,710,650 12/1987 Shoji .................................... 307/269
4,837,463 6/1989 Okitaka et al. ........................ 307/279

FOREIGN PATENT DOCUMENTS 0096914 5/1985 Japan .................................... 307/279

OTHER PUBLICATIONS

IBM Tech. Disc. Bul., vol. 30, No. 6, 11/87, "Structured CMOS Physical Design".

Primary Examiner—Stanley D. Miller
Assistant Examiner—Margaret Rose Wambach
Attorney, Agent, or Firm—Antonelli, Terry, Stout & Kraus

[57] ABSTRACT

A clock drive circuit device including clock drive circuits, each of which outputs a clock signal according to a predetermined logic function corresponding to the potential of condition signals, a circuit portion for executing the logic function which is composed of FETs, and has at least one FET for adjusting the FET configuration so that the number of FETs connected in series between a clock output terminal and a power source terminal as well as a ground terminal have predetermined values, respectively.

10 Claims, 6 Drawing Sheets

CLOCK DRIVE CIRCUIT

BACKGROUND OF THE INVENTION

1. Field of the Invention

This invention relates to a clock drive circuit which feeds clock signals to flipflops constituting a logic system and, in particular, to a clock drive circuit having a small clock skew which is suitable for increasing the working speed of the logic system.

2. Description of the Related Art

In order to form a high speed logic system, it is necessary to decrease clock skew by reducing delay time fluctuations in a plurality of clock drive circuits which feed clock signals to a number of flipflops within a logic system. As a method for reducing the clock skew, there is known a clock feeding method, as disclosed, e.g. in "1987 ISSCC Digest of technical papers", pp. 86–87, by which in order to feed clock signals to a number of flipflops within a logic system, differences in delay time associated with the clock input terminal of different flipflops are decreased so as to reduce the clock skew by distributing clock signals through a multi-stage buffer circuit and by unifying the fan-out and the wiring length of each of the stages.

In the clock drive circuit of a final stage in a clock feeding system which generates clock input signals for the flipflops, it is necessary to AND various sorts of condition signals for setting data in these flipflops and to use various sorts of logic circuits having different numbers of inputs. According to the prior art techniques described above, apart from the delay time in the clock drive circuit of the last stage, it is possible to reduce fluctuations in the other delay times in the clock feeding system and to achieve delay time fluctuations within the range of fluctuations being determined at the fabrication of semiconductor devices. However, when it is desired to further increase the working speed of the logic system, fluctuations in the signal delay time of the clock drive circuit in the final stage of the clock feeding system which have a number of inputs corresponding to logic functions give rise to other problems.

SUMMARY OF THE INVENTION

The object of this invention is to provide a clock drive circuit capable of realizing various logic functions and reducing fluctuations in delay time in different circuits, and to provide a method for using the clock drive circuit.

In order to achieve the above object, according to this invention, in a plurality of clock drive circuits having various logic functions, the logic circuit portion of each of the clock drive circuits is composed of FETs (Field Effect Transistors) so that the numbers of FETs connected in series between the power supply terminal and the output terminal as well as between the ground terminal and the output terminal are always equal. According to this invention, a clock drive circuit having a smaller number of condition signals for forming the clock output signal includes FETs for adjusting the number of FETs in the series connection portion, in order to equalize the number of the above-mentioned FETs connected in series to the number of such FETs in another clock drive circuit having a greater number of condition signals.

In a preferred embodiment of this invention, the gate electrode of the FET closest to the output terminal among the above-mentioned plurality of FETs connected in series is connected to the clock input terminal and the gate electrodes of the other FETs are connected to the condition input terminals. The gate electrodes of the FETs inserted for adjusting the number is connected to, e.g., $V_{SS}$, which is the ground potential.

According to this invention, since the number of FETs existing in a path through which the load capacitance of the logic circuit portion of the clock drive circuits is charged or discharged is equal for any of the clock drive circuits, it is possible to reduce fluctuations in delay time.

Further, by connecting the gate electrode of the FET closest to the output terminal among the FETs connected in series between the output terminal and the power supply terminal or the ground terminal to the clock input terminal, it is possible to decrease fluctuations in the area of the diffusion layer, whose diffusion capacitance is charged or discharged, when the clock signal varies and the output of the clock drive circuit changes, to further reduce fluctuations in delay time.

DESCRIPTION OF THE PREFERRED EMBODIMENTS

Hereinbelow an embodiment of this invention will be explained, with reference to the drawings.

Figure 2A:
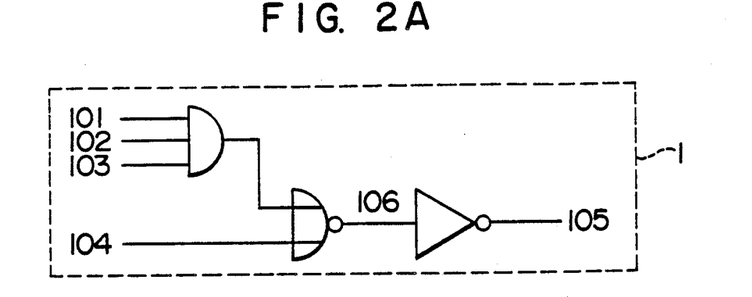
FIGS. 2A and 2B are logic schemes of two clock drive circuits having different logic functions for generating clock output signals.
Figure 2B:
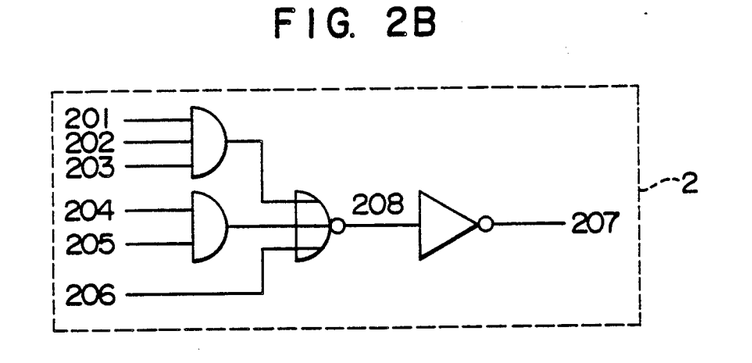

At first, examples of the clock drive circuit having different logic functions for generating clock output signals will be explained with reference to FIGS. 2A and 2B. In FIG. 2A, reference numeral 1 represents a clock drive circuit having a 2-stage construction consisting of an AND-OR inverter circuit of 3-1 inputs and an inverter circuit. In FIG. 2B, reference numeral 2 represents a clock drive circuit consisting of an AND-OR inverter circuit of 3-2-1 inputs and an inverter circuit. In the clock drive circuit 1, a clock signal and 2 flipflop data set condition signals of flipflops are inputted through inputs 101, 102 and 103, respectively. An output 106 obtained by taking the NOR of the AND output of these signals and a diagnostic clock input 104 for setting diagnostic data in a flipflop, when an LSI is diagnosed, is outputted to an output 105 through an inverter circuit serving as an output buffer. On the other hand, the clock drive circuit 2 is used in the case where there are two timings for setting data in the flipflop. Inputs 201, 202 and 203 of a first AND circuit are inputted as a first clock signal and 2 data set condition signals, respectively. Similarly, inputs 204 and 205 of a second AND circuit are inputted as a second clock signal and a data set condition signal. An output 208 obtained by taking the NOR of the outputs of these AND circuits and a diagnostic clock input 206 for setting diagnostic data in a flipflop, when the LSI is diagnosed, is outputted to an output 207 through an inverter circuit serving as an output buffer.

In the case where the two clock drive circuits 1 and 2 are used in one logic system, it is necessary to maintain deviations in timing between the clock outputs 105 and 207 of the two clock drive circuits within a tolerable region. For this purpose it is necessary to reduce deviations in timing between the clock inputs 101 and 201 of the two clock drive circuits and to equalize delay times from the input to the output of the two clock drive circuits. Since the former, i.e. the deviations in timing between the clock signal inputs, can be reduced by various well-known means to a satisfactory degree the problem, which is to be solved by the method of the present invention, is the latter, i.e., to equalize delay times from the input to the output. Consequently, in the following explanation, it should be understood that the deviations in timing between the clock signal inputs of different clock drive circuits are satisfactorily small.

Figure 1A:
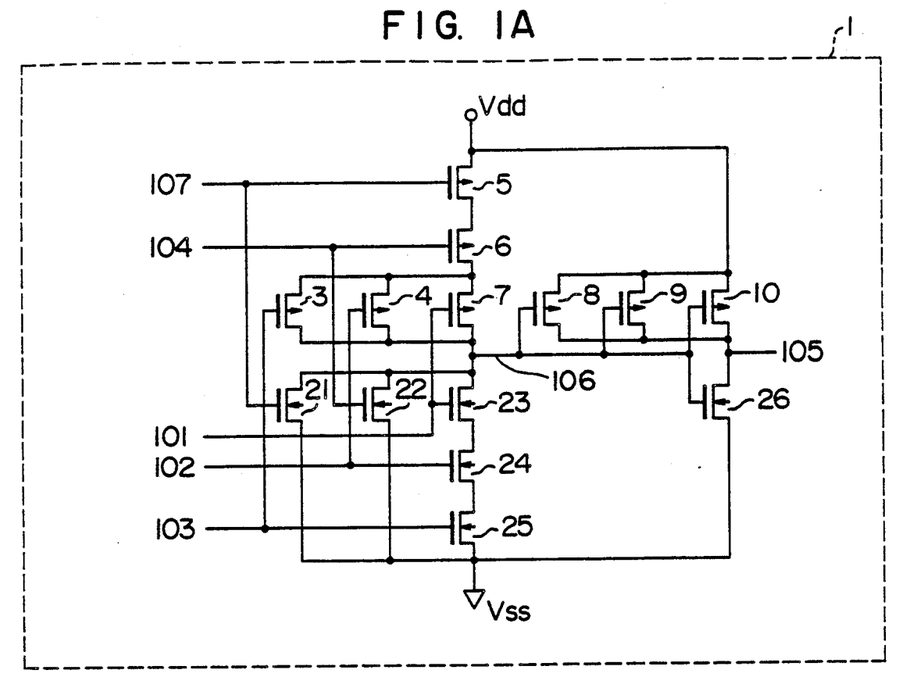
FIGS. 1A and 1B illustrate an embodiment of the clock drive circuit according to the present invention.
Figure 1B:
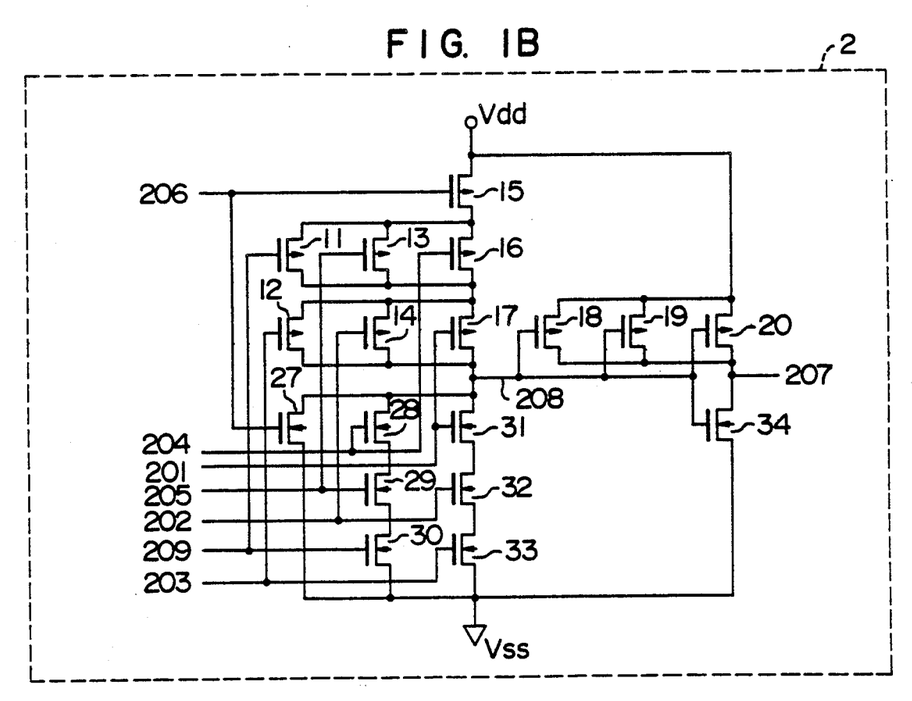

FIGS. 1A and 1B show an embodiment of the present invention which include two CMOS circuits for realizing the logic functions of the clock drive circuits 1 and 2 illustrated in FIGS. 2A and 2B, respectively. Reference numerals from 3 to 20 are PMOSFETs and from 21 to 34 are NMOSFETs. Nodes from 101 to 106 and from 201 to 208 correspond to the input and output terminals in FIGS. 2A and 2B, respectively. $V_{dd}$ represents the power supply voltage and $V_{ss}$ indicates the ground potential. The node 107 is connected to the potential $V_{ss}$ in order to realize the logic function of the clock drive circuit 1. Here the PMOSFET 5 is unnecessary for realizing the logic function of the clock drive circuit 1, but it is inserted in order to equalize the number of the PMOSFETs 5 to 7 connected in series between $V_{dd}$ and the node 107 to the number of the PMOSFETs 15 to 17 connected in series between $V_{dd}$ and the node 208 in the clock drive circuit 2. The NMOSFET 21 is inserted in order to be able to further increase the logic function, e.g., such as the logic function of the corresponding clock drive circuit indicated in FIG. 3, because the area remains unchanged, even if the NMOSFET is omitted, as seen from the layout scheme of the clock drive circuit explained later with reference to FIG. 5. If an increase in the logic function thereof is not required, the above-mentioned NMOSFET 21 may be omitted. On the other hand, in order to realize the logic function indicated in FIG. 1B, node 209 is connected to the potential $V_{dd}$. The NMOSFET 30 is unnecessary for realizing the logic function of the clock drive circuit 2, but it is inserted in order to equalize the number of the NMOSFETs 28 to 30 connected in series between the node 208 and $V_{ss}$ to the number of NMOSFET 23 to 25 connected in series between the node 106 and $V_{ss}$. The PMOSFET 11 is unnecessary for realizing the logic function indicated in FIG. 1B, but it is inserted in order to be able to further increase the logic function, e.g., such as the clock drive circuit indicated in FIG. 4, because the corresponding area remains unchanged, even if PMOSFET is omitted, as seen from the layout scheme of the clock drive circuit explained later with reference to FIG. 6. If an increase in the logic function thereof is not required, the PMOSFET 11 may be omitted. As described above, according to this embodiment, in the AND-OR inverter circuits representing the logic in each of the clock drive circuits, it is possible to equalize approximately the delay times therein owing to the fact that the resistances of the paths through which load capacitances are charged or discharged when the clock input signals vary to change their outputs are equalized by equalizing the number of FETs connected in series.

Figure 3:
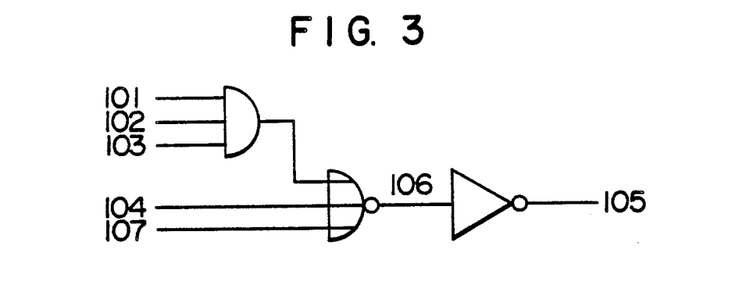
FIGS. 3 and 4 are logic schemes corresponding to the clock drive circuits indicated in FIGS. 1A and 1B, respectively.

As an example, in the circuit indicated in FIG. 1A for realizing the logic function indicated in FIG. 3, the states of conductance in the MOSFETs 7 and 23 are varied by a clock signal inputted through the terminal 101 and their load capacitances are charged or discharged. On the other hand, in the circuit indicated in FIG. 1B for realizing the logic function indicated in FIG. 4, the states of conductance in the MOSFETs 17 and 31 are varied by the clock signal inputted through the terminal 201 and their load capacitances are charged or discharged. In this case, since the charging or the discharging are effected through two series circuits consisting of equal numbers of MOSFETs (from the MOSFETs of the PMOSFETs 5, 6, 7 and 15, 16, 17 or the NMOSFETs 23, 24, 25 and 31, 32, 33), the charge or discharge time which cause delay is almost constant and thus it is possible to equalize the delay time therein.

Further, since the gate electrodes of the MOSFETs 7, 23 (FIG. 1A) and 17, 31 (FIG. 1B) located in the proximity of the output terminals 106 and 208 are connected to clock input terminals, the area of the diffusion layer, whose diffusion capacitance is charged or discharged when the clock signal varies and the outputs of the clock drive circuits change, is kept to be minimum and thus fluctuations in delay time are reduced.

Figure 5:
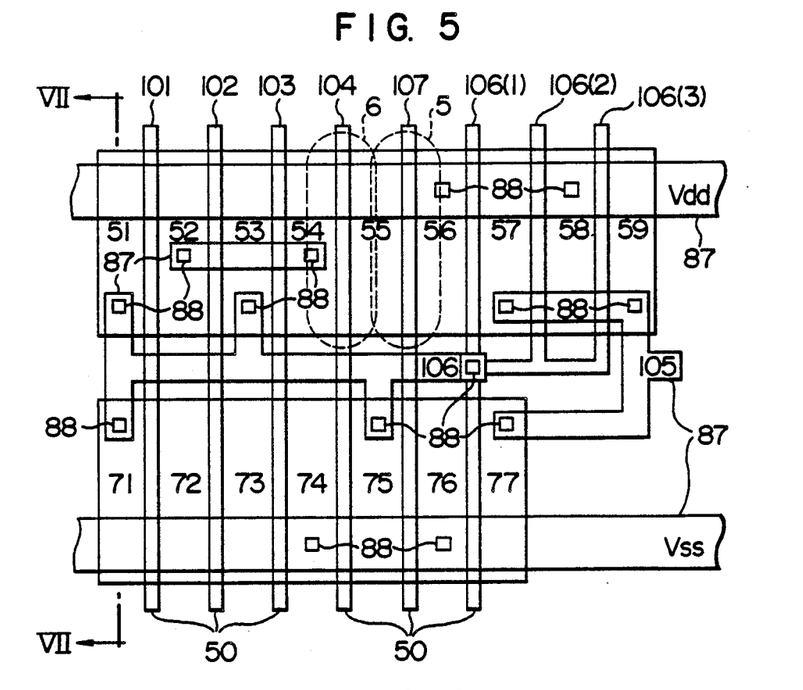
FIGS. 5 and 6 are schemes illustrating the layout of semiconductor devices for realizing the clock drive circuits indicated in FIGS. 1A and 1B, respectively.
Figure 6:
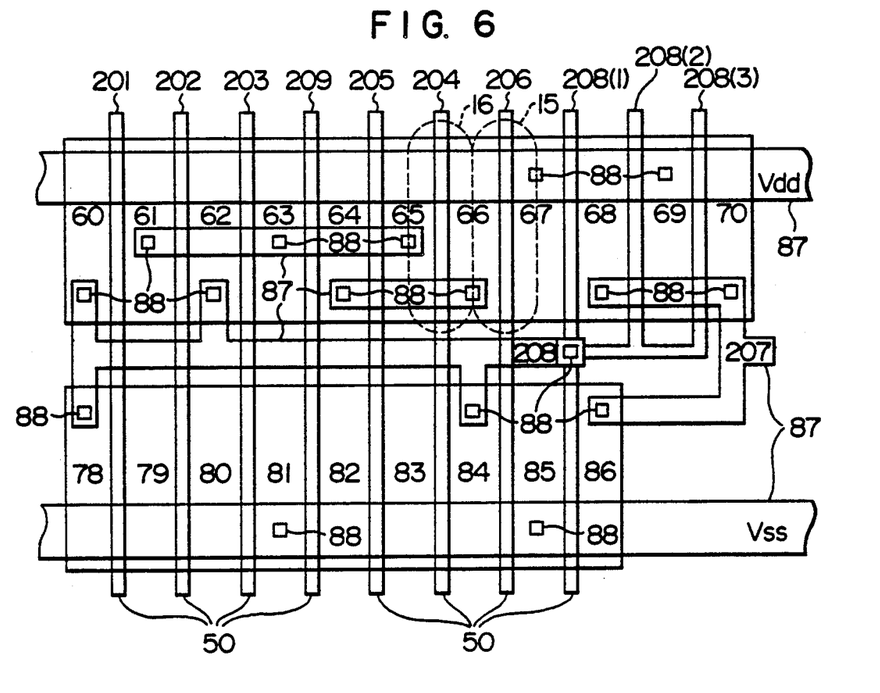
Figure 7:
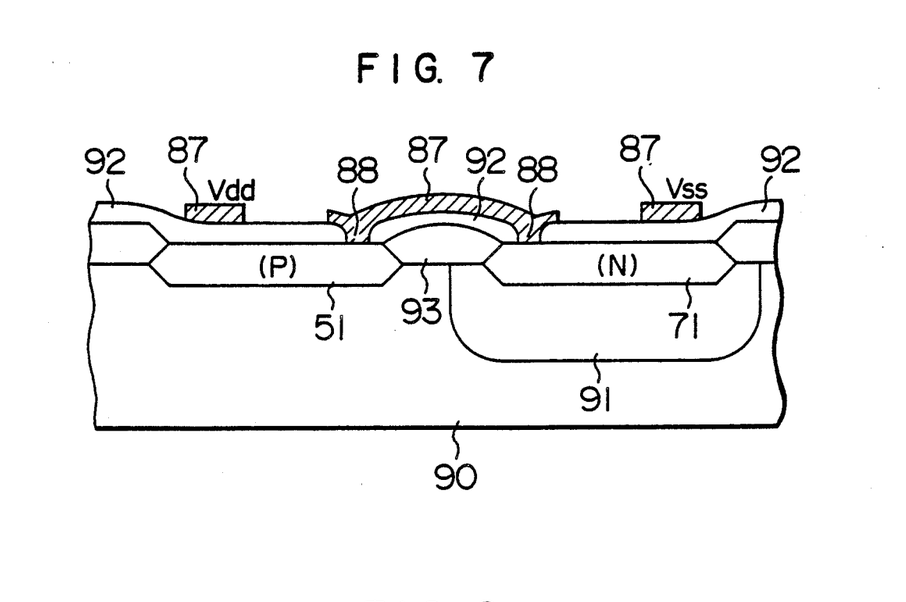
FIG. 7 is a cross-sectional view along the line VII—VII' in FIG. 5.

FIGS. 5 and 6 are LSI layout schemes for realizing the clock drive circuits indicated in FIGS. 1A and 1B, respectively, and FIG. 7 is a cross-sectional view along the line VII—VII' in FIG. 5. In these figures, reference numeral 50 is a gate electrode; 51 to 70 are P-conductivity type diffusion layers; 71 to 86 are N-conductivity type diffusion layers; 87 represents metal wiring; and 88 indicates contact portions connecting diffusion layers or the gate electrode with the metal wiring. Reference numerals 101 to 107 and 201 to 209 attached to the gate electrode 50 indicate the positions of the nodes indicated in FIGS. 1A and 1B, respectively. Further, reference numeral 90 is an N-conductivity type Si substrate; 91 is a P-well for forming an NMOSFET; 92 is an insulating layer; and 93 is a field oxide layer for isolating different MOSFETs. The capacitance of the diffusion layer of a MOSFET for which charging or discharging is required when the clock input signal in the clock drive circuit varies will be explained below, with reference to FIGS. 5, 6 and 7.

In the clock drive circuit 1 indicated in FIG. 1A, the clock input signal is inputted to the gate electrodes of the PMOSFET 7 and the NMOSFET 23, which are the closest to the node 106, among the FETs connected in series between $V_{dd}$ and $V_{ss}$ on one side and the node 106 on the other side, respectively, through the input terminal 101. It is assumed that the inputs 102 and 103 are at the potential $V_{dd}$ and the inputs 104 and 107 are at the potential $V_{ss}$, so that the output of the clock drive circuit is varied by the clock input when the clock input 101 varies. Consequently, the PMOSFETs 5 and 6 and the NMOSFETs 24 and 25 are conductive and the PMOSFETs 3 and 4 and the NMOSFETs 21 and 22 are cut off.

In the layout scheme indicated in FIG. 5, the regions indicated by broken lines 5 and 6 are the PMOSFETs 5 and 6, respectively. The gate electrodes of PMOSFETs 5 and 6 are the upper half portion of the gate electrodes 50 indicated by the nodes 107 and 104, respectively. The source and the drain electrodes of PMOSFET 5 are the diffusion layers 56 and 55, respectively. And the source and the drain electrodes of PMOSFET 6 are the diffusion layers 55 and 54, respectively. Since the drain electrode of the PMOSFET 5 and the source electrode of the PMOSFET 6 are connected to each other, as indicated in FIG. 1A, the drain and the source diffusion layers of PMOSFETs 5 and 6 overlap with a common region 55. In the same way, the PMOSFETs 7, 4, 3, 8, 9 and 10 consist of the upper half portion of the gate electrodes 50 indicated by the nodes 101, 102, 103, 106(1), 106(2) and 106(3), the diffusion layers 52, 52, 54, 56, 58 and 58 for the source electrodes and the diffusion layers 51, 53, 53, 57, 57 and 59 for the drain electrodes, respectively. Further the NMOSFETs 23, 24, 25, 22, 21 and 26 consist of the lower half portion of the gate electrodes 50 indicated by the nodes 101, 102, 103, 104, 107 and 106(1), the diffusion layers 72, 73, 74, 74, 76 and 76 for the source electrodes and the diffusion layers 71, 72, 73, 75, 75 and 77 for the drain electrodes, respectively. The diffusion layers for the source and the drain electrode of any two MOSFETs connected with each other overlap with a common region. Since the PMOSFETs 5 and 6 and the NMOSFETs 24 and 25 are conductive, the diffusion layers 56, 55, 54, 52 and 58 are at the potential $V_{dd}$ and the diffusion layers 76, 74, 73 and 72 are at the potential $V_{ss}$. Therefore, when the clock input 101 varies, the potentials of diffusion layers 51, 53, 71, 75, 57, 59 and 77 vary. The diffusion capacitances of the diffusion layers 51, 53, 71 and 75 are charged or discharged through the NMOSFETs 23, 24 and 25 connected in series, when the potential of the clock input 101 varies from $V_{ss}$ to $V_{dd}$, and through the PMOSFET 5, 6 and 7, connected in series, when the potential of the clock input 101 varies from $V_{dd}$ to $V_{ss}$. The diffusion capacitances of the diffusion layers 57, 59 and 77 are charged or discharged through the PMOSFETs 8, 9 and 10, when the potential of the node 106 varies from $V_{dd}$ to $V_{ss}$, and through the NMOSFET 26, when the potential Of the nOde 106 varies from $V_{ss}$ to $V_{dd}$.

On the other hand, in the clock drive circuit 2 indicated in FIG. 1B, a first clock input signal is inputted to the gate electrodes of the PMOSFET 17 and the NMOSFET 31, which are the closest to the node 208, among the MOSFETs connected in series between $V_{dd}$ and $V_{ss}$ on one side and the node 208 on the other side, respectively, through the input terminal 201. A second clock input signal is inputted to the gate electrodes of the PMOSFET 16, which is the second closest to the node 208, among the MOSFETs connected in series between $V_{dd}$ and the node 208 and the MOSFET 28 which is the closest to the node 208 among the MOSFETs connected in series between $V_{ss}$ and the node 208, through the input terminal 204. It is so that the inputs 202 and 203 are at the potential $V_{dd}$ and the inputs 204 and 206 are at the potential $V_{ss}$, so that the output of the clock drive circuit is varied by the clock input 201 when the first clock input 201 varies. Consequently the PMOSFETs 15 and 16 and the NMOSFETs 32 and 33 are conductive and the PMOSFETs 12 and 14 and the NMOSFETs 27 and 28 are cut off.

As in FIG. 5, in the layout scheme indicated in FIG. 6, the regions indicated by broken lines 15 and 16 are the PMOSFETs 15 and 16, respectively. The PMOSFETs 15, 16, 17, 14, 12, 11, 13, 18, 19 and 20 consist of the upper half portion of the gate electrodes 50 indicated by the nodes 206, 204, 201, 202, 203, 209, 205, 208(1), 208(2) and 208(3), the diffusion layers 67, 66, 61, 61, 63, 63, 65, 67, 69 and 69 for the source electrodes and the diffusion layers 66, 65, 60, 62, 62, 64, 64, 68, 68 and 70 for the drain electrodes, respectively. Further, the NMOSFETs 31, 32, 33, 30, 29, 28, 27 and 34 consist of the lower half portion of the gate electrodes 50 indicated by the nodes 201, 202, 203, 209, 205, 204, 206 and 208(1), the diffusion layers 79, 80, 81, 81, 82, 83, 85 and 85 for the source electrodes and the diffusion layers 78, 79, 80, 82, 83, 84, 84 and 86 for the drain electrodes, respectively. The diffusion layers of the source and the drain electrodes of any two MOSFETs connected with each other overlap with a common region similarly to that described with reference to FIG. 5. The diffusion layers 67, 66, 65, 64, 63, 61 and 69 are at the potential $V_{dd}$ and the diffusion layers 85, 81, 80 and 79 are at the potential $V_{ss}$. Further, the diffusion layers 83 and 82 are isolated from the diffusion layer 84 by the gate electrode 50 indicated by the node 204. Therefore, when the clock input 201 varies, it is the diffusion layers 60, 62, 78, 84, 68, 70 and 86 that have potentials thereof vary. Among them, the diffusion capacitances of the diffusion layers 60, 62, 78 and 84 are charged or discharged through the NMOSFETs 31, 32 and 33 connected in series when the potential of the clock input 201 varies from $V_{ss}$ to $V_{dd}$, and through the PMOSFET 15, 16 and 17, connected in series when the potential of the clock input 201 varies from $V_{dd}$ to $V_{ss}$. The diffusion capacitances of the diffusion layers 68, 70 and 86 are charged or discharged through the PMOSFET 18, 19 and 20 when the potential of the node 208 varies from $V_{dd}$ to $V_{ss}$, and through the NMOSFET 34 when the potential of the node 208 varies from $V_{ss}$ to $V_{dd}$. As described above, according to this embodiment, it is possible to equalize the area of the diffusion layers of the MOSFETs for which charge or discharge is required when the clock input 101 of the clock drive circuit 1 varies to the area of the diffusion layers of the diffusion capacitances of the FETs for which charge or discharge is required, when the first clock input 201 of the clock drive circuit 2 varies.

Next, the diffusion layer, whose potential varies, when the second clock input 204 changes, will be explained. In this case, the inputs 205 and 209 are at the potential $V_{dd}$ and the inputs 201 and 206 are at the potential $V_{ss}$ so that the output of the clock drive circuit is varied by the clock input 204. Consequently, the PMOSFETs 15 and 17 and the NMOSFETs 29 and 30 are conductive and the PMOSFETs 11 and 13 and the NMOSFETs 27 and 31 are cut off. The diffusion layers 67, 66, 64 and 69 are at the potential $V_{dd}$ and the diffusion regions 85, 81, 82 and 83 are at the potential $V_{ss}$. Further, the diffusion layers 79 and 80 are isolated from the diffusion layer 78 by the gate electrode 50 indicated by the node 201. Therefore, it is the diffusion layers 60, 61, 62, 63, 65, 78, 84, 68, 70 and 86 that have potentials which vary when the clock input 204 changes. Among them, the diffusion capacitances of the diffusion layers 60, 61, 62, 63, 65, 78 and 84 are charged or discharged through the NMOSFETs 28, 29 and 30 connected in series, when the potential of the clock input 204 varies from $V_{ss}$ to $V_{dd}$ and through the PMOSFETs 15, 16 and 17 connected in series, when the potential of the clock input 204 varies from $V_{dd}$ to $V_{ss}$. The diffusion capacitances of the diffusion layers 68, 70 and 86 are charged or discharged through the PMOSFETs 18, 19 and 20 when the potential of the node 208 varies from $V_{dd}$ to $V_{ss}$, and through the NMOSFET 34, when the potential of the node 208 varies from $V_{ss}$ to $V_{dd}$.

Further, in the layouts indicated in FIGS. 5 and 6, the diffusion layers for the source or drain electrode of 2 MOSFETs connected to each other overlap with a common region, and are formed in reality by one diffusion layer. The PMOSFET 11 in FIG. 1B is composed of the diffusion region 64 for the source electrode, serving also as the diffusion layer for the source electrode of the PMOSFET 13 and the diffusion layer 63 for the drain electrode serving also as the diffusion layer for the drain electrode of the PMOSFET 12. Even if the PMOSFET 11 is omitted, since it is necessary to isolate the diffusion regions 63 and 64 from each other and therefore a field oxide layer is formed therebetween, the area of the whole device remains almost unchanged.

Although, in the embodiment described above, the inverter circuit, which is an output buffer of the clock drive circuit, is a CMOS circuit, in the case where it is required to further increase the load driving power, it is desirable to construct the inverter circuit with a Bi CMOS circuit using a bipolar transistor as the transistor serving as the output buffer. Embodiments therefor are indicated in FIGS. 8, 9A and 9B.

Figure 8:
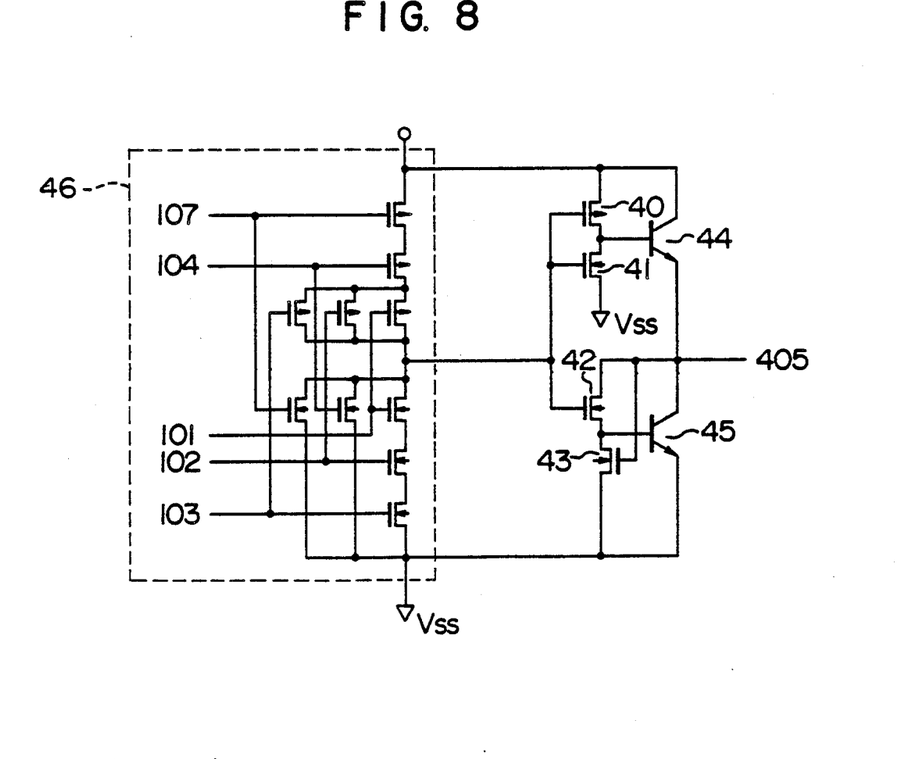
FIG. 8 is a circuit diagram illustrating a clock drive circuit using a Bi CMOS circuit in the output buffer in FIG. 1A or 1B.

FIG. 8 indicates the embodiment in which a logic circuit portion 46 is identical to the construction composed of the PMOSFETs 1 to 7 and the NMOSFETs 21 to 25 in FIG. 1A, except that a Bi CMOS circuit, in which a PMOSFET 40, NMOSFETs 41, 42, 43 and bipolar transistors 44, 45 are combined, is used for the inverter circuit.

Figure 4:
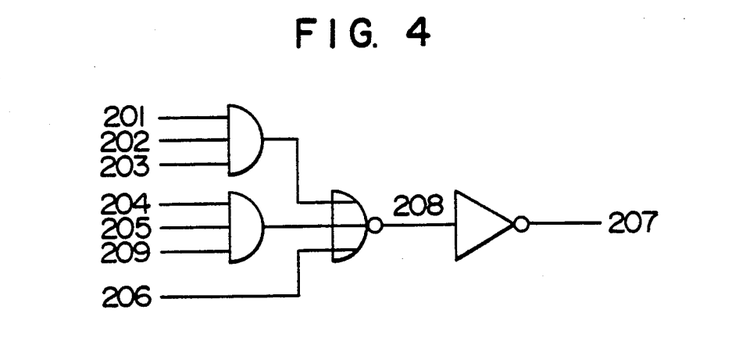

The clock drive circuit 2 can be realized as a circuit having the logic function indicated in FIG. 4 by replacing the logic circuit portion 46 indicated in FIG. 8 by a construction composed of the PMOSFETs 11 to 17 and the NMOSFETs 27 to 33 in FIG. 1B. Other well-known techniques may be used for the Bi CMOS circuit.

Figure 9A:
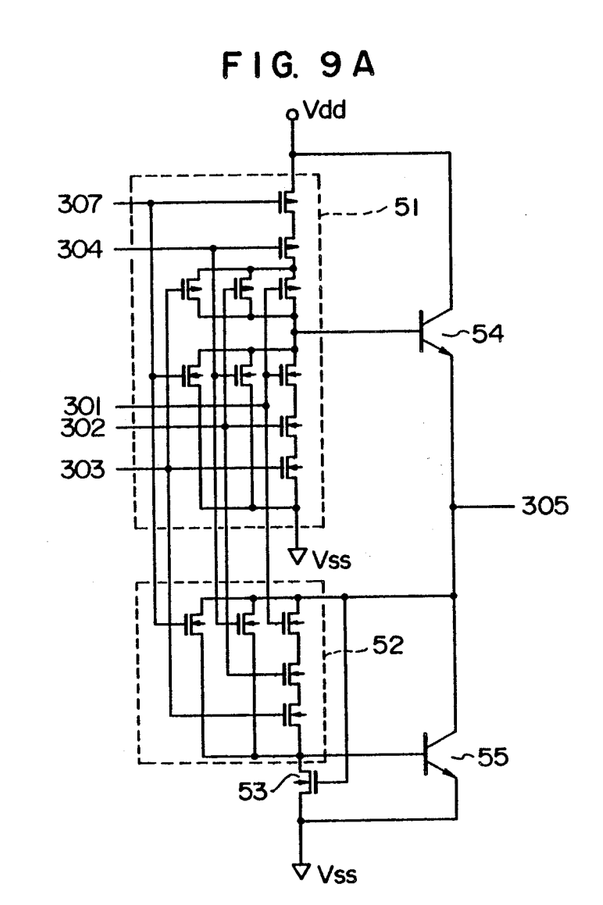
FIGS. 9A and 9B are circuit diagrams illustrating Bi CMOS circuits for the clock drive circuits indicated in FIGS. 1A and 1B, respectively.
Figure 9B:
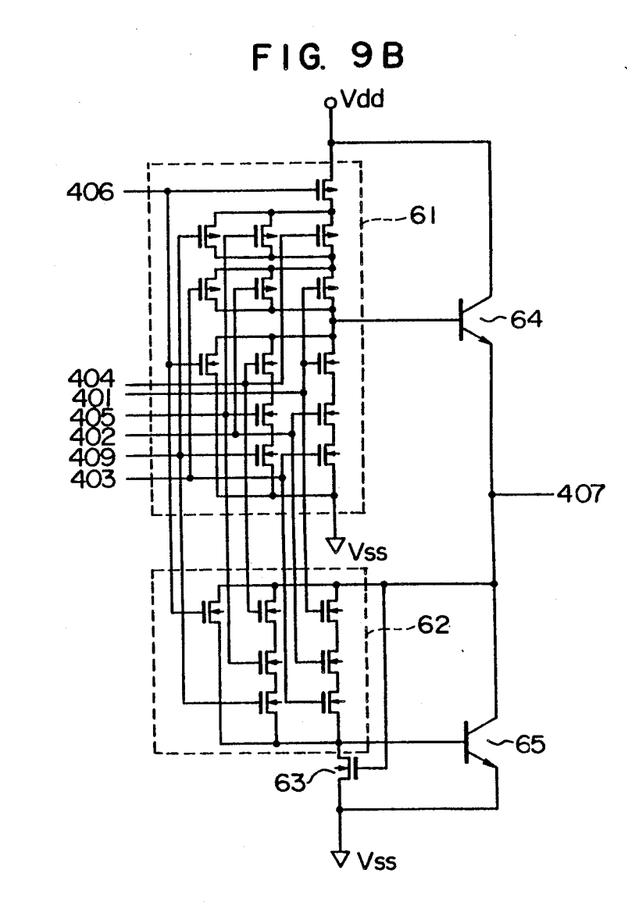
Figure 10:
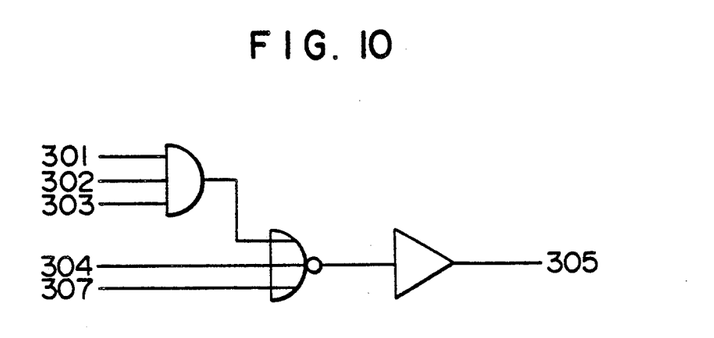
FIGS. 10 and 11 are logic schemes corresponding to the clock drive circuits indicated in FIGS. 9A and 9B, respectively.
Figure 11:
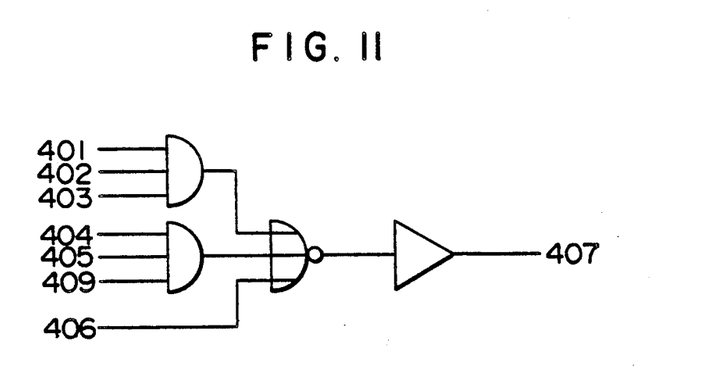

While, in FIG. 8, the MOSFETs 40 to 43 are used for driving the bipolar transistors 44 and 45, in the embodiments indicated in FIGS. 9A and 9B, the portion driving the output bipolar transistors has the logic function. FIG. 9A corresponds to the clock drive circuit 1 and FIG. 9B corresponds to the clock drive circuit 2. However, the output buffers are not inverters, but they have the logic functions indicated in FIGS. 10 and 11, respectively. In FIG. 9A, 54 and 55 are bipolar transistors; 51 is a driving circuit for the bipolar transistor 54; and 52 and an NMOSFET 53 constitute a driving circuit for the bipolar transistor 55.

The driving circuit 51 has a construction which is identical to the circuit composed of the PMOSFETs 1 to 7 and the NMOSFETs 21 to 25 constituting the logic circuit portion in FIG. 1A, while 52 has a construction, which is identical to the circuit composed of the NMOSFETs 21 to 25 in the logic circuit portion indicated in FIG. 1A. However, in 52, the source electrodes of the NMOSFETs 21, 22 and 25 are connected to the base electrode of the bipolar transistor 55 instead of the ground $V_{ss}$, and the drain electrodes of the NMOSFETs 21, 22, 23 are connected to the collector electrode of the bipolar transistor 55 instead of the node 106. In this way logic signals, which are complementary to each other, are applied to the base electrodes of the bipolar transistors 54 and 55. The NMOSFET 53 is used for drawing the base charge, when the bipolar transistor 55 is cut off. Similarly, in FIG. 9B, 64 and 65 are bipolar transistors, 61 is a driving circuit for the bipolar transistor 64, and 62 and an NMOSFET 63 constitute a driving circuit for the bipolar transistor 65. The driving circuit 61 has a construction which is identical to the one composed of the PMOSFETs 11 to 17 and the NMOSFETs 27 to 33 constituting the logic circuit portion in FIG. 1B while 62 has a construction, which is identical to the one composed of the NMOSFETs 27 to 33 in the logic circuit portion indicated in FIG. 1B. However, in 62, the source electrodes of the NMOSFETs 27, 30 and 33 are connected to the base electrode of the bipolar transistor 65 instead of the ground $V_{ss}$, and the drain electrodes of the NMOSFETs 27, 28, 31 are connected to the collector electrode of the bipolar transistor 65 instead of the node 208. In this way, logic signals which are complementary to each other are applied to the base electrodes of the bipolar transistors 64 and 65. The NMOSFET 63 is used for drawing the base charge, when the bipolar transistor 65 is cut off.

In either case, since the logic circuit portions are identical to those in the first and the second embodiments, they have the same effect, considering the fact that the difference between the delay times of the clock output signals in the driving circuits 1 and 2, when the clock input signals therefor vary, is reduced.

Further, in the embodiments indicated in FIGS. 9A and 9B, since it is the intensity of the base currents, which can be made to flow through the bipolar transistors 54, 55, 64 and 65 that has principal influences on the delay time of the clock drive circuit, it is sufficient to equalize the numbers of PMOSFETs or NMOSFETs connected in series, which feed them therewith, and the influence of the positions of the MOSFETs, whose inputs are clock signals, are smaller than those in the other embodiments.

Although, in the embodiments described above, the numbers of MOSFETs connected in series are equalized both for PMOSFETs and for NMOSFETs, in the case where they are designed while defining the timing for determining data for flipflops used in the logic system with respect to either one of the rising and the falling of the clock signals, it is sufficient to equalize the numbers of either one of PMOSFETs or NMOSFETs so that the skew of the timing is reduced only for the one of them. For the example indicated in FIGS. 1A and 1B, in the case where they are designed while defining the timing by the rising of the outputs 105 and 207 of the clock drive circuits, it is sufficient to equalize the delay times of the falling of the nodes 106 and 208. Consequently it is sufficient to equalize the numbers of the NMOSFETs connected in series and the PMOSFET 5 and the NMOSFET 21 are not always necessary.

According to this invention, in clock drive circuits, in which the outputs are switched over by clock input signals, it is possible to equalize the values of resistance in the different driving circuits by equalizing the numbers of MOSFETs included in the paths through which the load capacitances thereof are charged or discharged. Therefore, in a plurality of clock driving circuits having different logic functions, it is possible to equalize approximately the delay times from the clock input to the output therein.

Furthermore, it is possible to reduce the difference in the diffusion capacitance, for which charging or discharging are required, when the clock input varies in different clock drive circuits, by placing the MOSFETs connected t the clock input terminal in the proximity of the output terminal and to thus reduce the clock skew.

In addition, since the diffusion capacitance itself, for which charging or discharging are necessary, can be reduced and therefore the delay time of the clock drive circuit can be shortened, it is possible to reduce the absolute value of fluctuations in the delay time produced by fluctuations in characteristics of MOSFETs at the time of fabrication of the semiconductors and thus to thereby reduce the clock skew.

Although this invention has been explained by referring to embodiments using CMOS's and Bi CMOS's, it can be applied to other circuit types, e.g., an NMOS circuit, or the like.

We claim:

1. A clock drive circuit device comprising a plurality of clock drive circuits configured to perform different logic operations, respectively, each one of said clock drive circuits including:
   first and second power supply terminals connected to high and low voltage sources, respectively;
   a plurality of first input terminals through which predetermined condition signals are inputted;
   at least one second input terminal for receiving a clock input signal;
   an output terminal through which an output signal is outputted at a timing determined by the clock input signal and the predetermined condition signals;
   a first series connection of a first set of FETs connected in series between said first power supply terminal and said output terminal and a second series connection of a second set of FETs connected in series between said second power supply terminal and said output terminal, each of said first and second sets of FETs having a gate connected to a selected one of said at least one second input terminal and said first input terminals so that said first and second sets of FETs determine the logical operaton of the clock drive circuit in order to produce the output signal at said output terminal in response to the clock input signal received by said at least one second input terminal when the predetermined condition signals are inputted through said plurality of first input terminals; and
   at least one third FET connected in series to at least one of said first and second series connections for compensating for a difference between an input-to-output signal delay time inherent in the clock drive circuit and an input-to-output signal delay time inherent in another of the plurality of clock drive circuits, said at least one third FET being unrelated to the logical operation of the clock drive circuit.

2. A clock drive circuit device according to claim 1, wherein in each of said plurality of clock drive circuits said at least one second input terminal is connected to the gate of one of the first and second sets of FETs, said one of the first and second sets of FETs being located nearest the said output terminal among one of the first and second series of FETs to which said one of the first and second sets of FETs belongs.

3. A clock drive circuit device according to claim 1, wherein said first and second sets of FETs are constituted by CMOS circuits.

4. A clock drive circuit device according to claim 1, wherein in each of said plurality of clock drive circuits a drive portion is connected between the output terminal and a clock drive circuit load, and said drive portion is constituted by Bi-CMOS circuits.

5. A clock drive circuit device according to claim 1, wherein:
   the number of FETs connected to and within said first series connection and the number of FETs connected to and within said second series connection in the clock drive circuit are respectively equivalent to the number of FETs connected to and within said first series connection and the number of FETs connected to and within said second series connection in another of the plurality of clock drive circuits.

6. A clock drive circuit device comprising a plurality of clock drive circuits configured to perform different logic operations, respectively, each one of said clock drive circuits including:
   first and second power supply terminals connected to high and low voltage sources, respectively;
   a plurality of first input terminals through which predetermined signals are inputted;
   at least one second input terminal for receiving a clock input signal;
   an output terminal through which an output signal is outputted at a timing determined by the clock input signal and the predetermined condition signals;
   a first series connection of a first set of FETs connected in series between said first power supply terminal and said output terminal and a second series connection of a second set of FETs connected in series between said second power supply terminal and said output terminal, each of said first and second sets of FETs having a gate connected to a selected one of said at least one second input terminal and said first input terminals so that said first and second sets of FETs determine the logical operation of the clock drive circuit in order to produce the output signal at said output terminal in response to the clock input signal received by said at least one second input terminal when the predetermined condition signals are inputted through said plurality of first input terminals;
   a driving section connected between said output terminal and a clock drive circuit load; and
   at least one third FET connected in series to at least one of said first and second series connections for compensating for a difference between an input-to-output signal delay time inherent in the clock drive circuit and an input-to-output signal delay time inherent in another of the plurality of clock circuits, said at least one of the first and second series connections providing a discharging path for discharging the capacitive electric charges in diffusion layers of a semiconductor circuit device constituting the first and second sets of FETs of the clock drive circuit when the first and second sets of FETs of the clock drive circuit change from one of ON and OFF states to a different state with variations in potential of the clock input signal received by said at least one second input terminal, and said at least one third FET being unrelated to the determination of the logical operation of the clock drive circuit.

7. A clock drive circuit device according to claim 6, wherein the number of FETs connected to and within said first series connection and the number of FETs connected to and within said second series connection in the clock drive circuit are respectively equivalent to the number of FETs connected to and within said first series connection and the number of FETs connected to and within said second series connection in another of the plurality of clock drive circuits.

8. A clock drive circuit device according to claim 6, wherein in each of said plurality of clock drive circuits said second input terminal is connected to the gate of one of the first and second sets of FETs included in one of said first and second series connections providing the discharging path, said one of the first and second sets of FETs being located nearest to said output terminal among the series connection of FETs providing the discharging path.

9. A clock drive circuit device according to claim 6, wherein said first and second sets of FETs in each of the plurality of clock drive circuits are selected so that the total area of the diffusion layers of the FETs which are changed from one of ON and OFF states to a different state when the potential of the clock input signal varies is substantially the same for each of said plurality of clock drive circuits.

10. In a clock drive circuit device comprising first and second clock drive circuits configured to perform different logic operations, respectively, each one of said clock drive circuits including:

first and second power supply terminals connected to high and low voltage sources, respectively;

a plurality of first input terminals through which predetermined condition signals are inputted;

at least one second input terminal for receiving a clock input signal;

an output terminal through which an output signal is outputted at a timing determined by the clock input signal and the predetermined condition signals;

a first series connection of a first set of FETs connected in series between said first power supply terminal and said output terminal and a second series connection of a second set of FETs connected in series between said second power supply terminal and said output terminal, each of said first and second sets of FETs having a gate connected to a selected one of said at least one second input terminal and said first input terminals so that said first and second sets of FETs determine the logical operation of the clock drive circuit in order to produce the output signal at said output terminal in response to the clock input signal received by said at least one second input terminal when the predetermined condition signals are inputted through said plurality of first input terminals;

a method of adjusting the configuration of the clock drive circuit device comprising the steps of:

determining the number of FETs included within at least one of said first and second series connections of said first clock drive circuit;

determining the number of FETs included within at least one of said first and second series connections of said second clock drive circuits; and adding at least one FET unrelated to the determination of the logical operation of the first and second clock drive circuits to at least one of the first and second series connections in said first and second clock drive circuit when either the number of FETs in the first series connection of said first clock drive circuit does not equal the number of FETs in said first series connection of said clock drive circuit, or when the number of FETs in the second series connection of said first clock drive circuit does not equal the number of FETs in the second series connection of the second clock drive circuit, so that the number of FETs in each first series connection is the same and the number of FETs in each second series connection is the same, whereby a difference between an input-to-output signal delay time inherent in the first clock drive circuit and an input-to-output signal delay time inherent in the second clock drive circuit is compensated for.

* * * * *